(12) United States Patent
Satoh et al.

(10) Patent No.: US 6,759,925 B2
(45) Date of Patent: Jul. 6, 2004

(54) RADIO-FREQUENCY HYBRID SWITCH MODULE

(75) Inventors: Yuki Satoh, Osaka (JP); Tetsuya Tsurunari, Osaka (JP); Kozo Murakami, Osaka (JP); Yoshiharu Omori, Osaka (JP); Masaaki Hayama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/148,702

(22) PCT Filed: Oct. 5, 2001

(86) PCT No.: PCT/JP01/08792

§ 371 (c)(1),
(2), (4) Date: Sep. 10, 2002

(87) PCT Pub. No.: WO02/32001

PCT Pub. Date: Apr. 18, 2002

(65) Prior Publication Data

US 2003/0048154 A1 Mar. 13, 2003

(30) Foreign Application Priority Data

Oct. 6, 2000 (JP) ......................................... 2003-07276

(51) Int. Cl.[7] ............................. H03H 9/64; H03H 9/72; H01P 1/10
(52) U.S. Cl. ........................ 333/133; 333/193; 333/101
(58) Field of Search ........................ 333/133, 193–198, 333/101

(56) References Cited

U.S. PATENT DOCUMENTS

| | | | | |
|---|---|---|---|---|
| 6,060,960 A | * | 5/2000 | Tanaka et al. | ............... 333/104 |
| 6,252,778 B1 | * | 6/2001 | Tonegawa et al. | ........... 361/761 |
| 6,445,262 B1 | * | 9/2002 | Tanaka et al. | ............... 333/133 |
| 6,456,172 B1 | * | 9/2002 | Ishizaki et al. | .............. 333/133 |
| 6,570,469 B2 | * | 5/2003 | Yamada et al. | .............. 333/193 |

FOREIGN PATENT DOCUMENTS

| | | |
|---|---|---|
| EP | 0 794 616 | 9/1997 |
| EP | 0 820 155 | 1/1998 |
| JP | 62-171327 | 7/1987 |
| JP | 8-8605 | 1/1996 |
| JP | 9-246905 | 9/1997 |
| JP | 10-93383 | 4/1998 |
| JP | 11-154804 | 6/1999 |

OTHER PUBLICATIONS

International Search Report corresponding to application No. PCT/JP01/08792 dated Jan. 15, 2002, Along with English translation.

* cited by examiner

Primary Examiner—Barbara Summons
(74) Attorney, Agent, or Firm—RatnerPrestia

(57) ABSTRACT

A small radio-frequency hybrid switch module is provided for switching between transmitted signals and received signals in plural frequency bands. This module includes: a laminated body including a dielectric layer; a diplexer; a switching circuit; a low pass filter (LPF); a conductive pattern provided on the dielectric layer for forming at least one of the diplexer, the switching circuit and the LPF; a surface acoustic wave (SAW) filter mounted on the laminated body; a cover provided on the SAW filter for forming a cavity which allows surface acoustic wave vibration and for hermetically sealing the cavity; and a semiconductor switching device mounted on the laminated body for forming a part of the switching circuit.

11 Claims, 8 Drawing Sheets

US 6,759,925 B2

RADIO-FREQUENCY HYBRID SWITCH MODULE

THIS APPLICATION IS A U.S. NATIONAL PHASE APPLICATION OF PCT INTERNATIONAL APPLICATION PCT/JP01/08792.

TECHNICAL FIELD

The present invention relates to a radio-frequency hybrid switch module for use in mobile communications equipment including a mobile phone.

BACKGROUND ART

FIG. 1 is a circuit block diagram of an antenna duplexer used in a GSM/DCS dual-band mobile phone conforming to European standards for mobile communications based on a Time Division Multiple Access system. The antenna duplexer includes antenna terminal 1, GSM-band transmitting (GSM-TX) terminal 2, GSM-band receiving (GSM-RX) terminal 3, DCS-band transmitting (DCS-TX) terminal 4, DCS-band receiving (DCS-RX) terminal 5, diplexer 6 for separating and combining frequency components in GSM and DCS bands, switches 7, 8 for switching between transmission and reception, low pass filters (LPFs) 9, 11 for removing unwanted harmonic signals, and surface acoustic wave (SAW) filters 10, 12 for allowing a band of received frequencies to pass.

FIG. 10 shows a structure of a conventional antenna duplexer. This antenna duplexer includes ceramic multi-layer substrate 18, alumina package 19, SAW device chip 20, bonding wire 21, lid 22 of alumina package 19, diodes 23 functioning as switching devices, chip devices 24, pad 25 formed on the alumina package for wire bonding, and metal cap 26. Ceramic multi-layer substrate 18 includes a LPF and a diplexer formed therein.

In the duplexer described above, SAW chip 20 is put in alumina package 19 and mounted over ceramic multi-layer substrate 18. Alumina package 19, for being sealed hermetically with lid 22, needs to has a wall thickness 19a ranging from about 0.5 mm to 1.0 mm, Thus hardly having a reduced size.

DISCLOSURE OF THE INVENTION

A small radio-frequency (RF) hybrid switch module is provided for switching between transmit-signals and receive-signals in plural frequency bands.

This module includes: a laminated body having a dielectric layer; a diplexer; a switching circuit; a low pass filter (LPF); a conductive pattern on the dielectric layer for forming at least one of the diplexer, the switching circuit and the LPF; a surface acoustic wave (SAW) filter mounted on the laminated body; a cover on the SAW filter for forming a cavity which allows surface acoustic wave vibration and hermetically sealing the cavity, and a semiconductor switching device mounted on the laminated body for forming a part of the switching circuit.

BEST MODES FOR CARRYING OUT THE INVENTION

First Exemplary Embodiment

FIGS. 1–4 are circuit block diagrams each illustrating a radio-frequency (RF) hybrid switch module for a GSM/DCS mobile phone conforming with European standards for mobile communications. The module includes switch 13 for switching between transmission and reception in GSM and DCS bands, diplexers 14, 15, low pass filters (LPFs) 9, 11 for removing harmonics, and SP4T switch 17.

Figure 1:
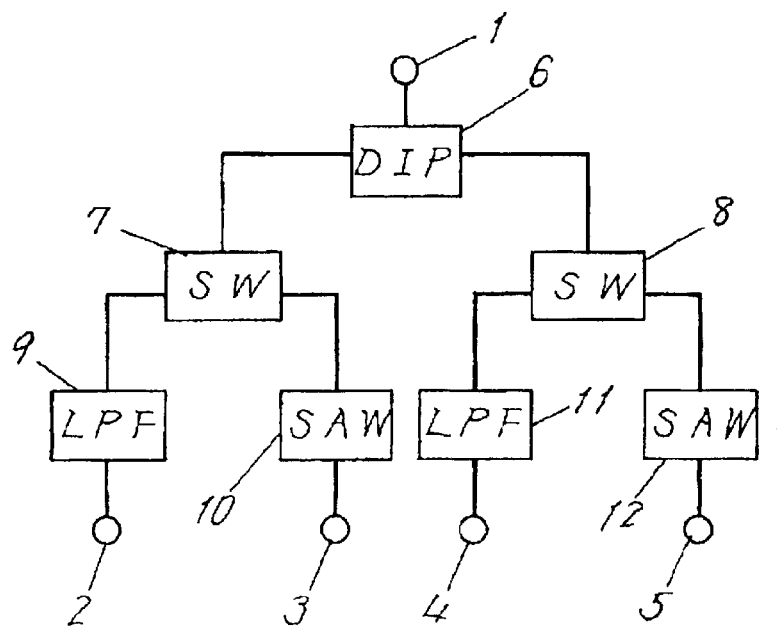
FIG. 1 is a circuit block diagram of a radio-frequency (RF) hybrid switch module in accordance with first to fourth exemplary embodiments of the present invention.

In the circuit illustrated by FIG. 1, antenna terminal 1 is connected to diplexer 6 which separates and combines signals in the GSM and DCS bands. Respective terminals for the GSM and DCS bands of diplexer 6 are connected to switches 7 and 8, respectively. Transmitting sides of switches 7, 8 are connected to LPFs 9, 11, respectively, while receiving sides of switches 7, 8 are connected to surface acoustic wave (SAW) filters 10, 12, respectively. Filters 9, 10, 11, 12 are connected to terminals 2, 3, 4 and 5, respectively.

Figure 2:
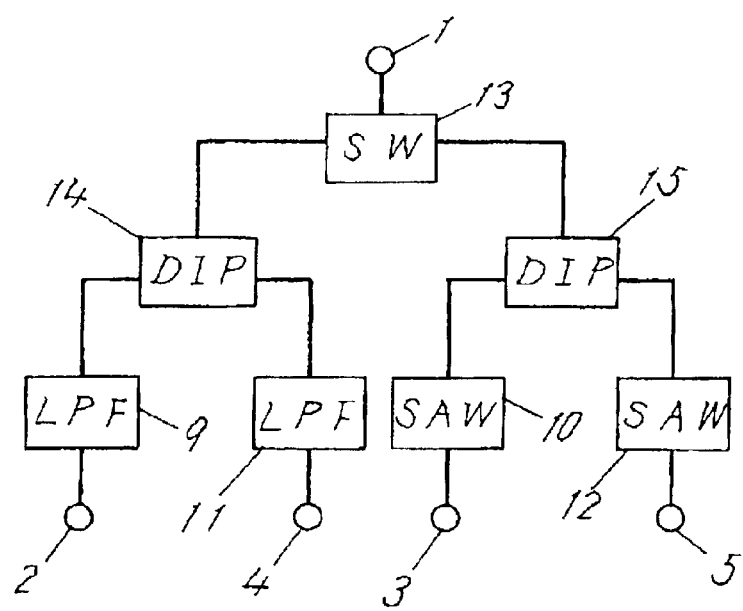
FIG. 2 is another circuit block diagram of an RF hybrid switch module in accordance with the first to fourth embodiments.

In the circuit illustrated by FIG. 2, an antenna terminal is connected to switch 13. Switch 13 separates signals into transmitted signals and received signals. Diplexers 14, 15 separate and combine the signals in the GSM and DCS bands. Transmitting terminals of diplexer 14 are connected to LPFs 9 and 11, respectively, while receiving terminals of diplexer 15 are connected to SAW filters 10 and 12, respectively. Filters 9, 10, 11, 12 are connected to terminals 2, 3, 4 and 5, respectively.

Figure 3:
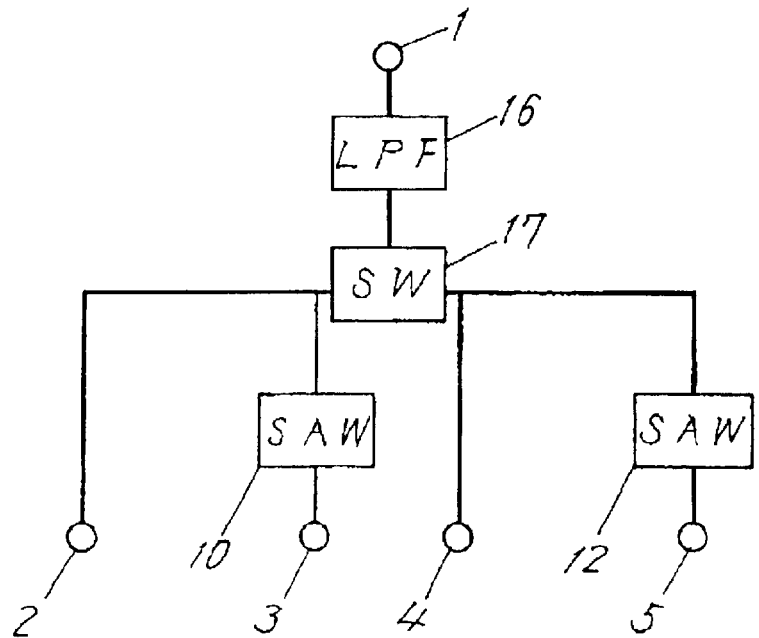
FIG. 3 is a further circuit block diagram of an RF hybrid switch module in accordance with the first to fourth embodiments.

In the circuit illustrated by FIG. 3, LPF 16 for removing a harmonic component from a transmitted signal is connected to antenna terminal 1. SP4T switch 17 allocates the transmitted signals and received signals among terminals 2, 3, 4, and 5. Receiving terminals of switch 17 are coupled to terminals 3, 5 via SAW filters 10, 12, respectively.

Figure 4:
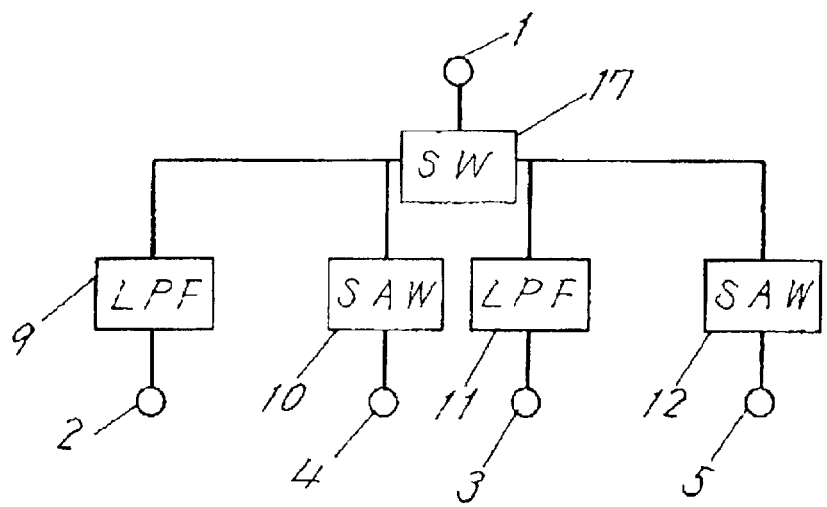
FIG. 4 is a still further circuit block diagram of an RF hybrid switch module in accordance with the first to fourth embodiments.

In the circuit illustrated by FIG. 4, SP4T switch 17 is connected to antenna terminal 1. Transmitting terminals of switch 17 are connected to LPFs 9, 11, respectively, while receiving terminals of switch 17 are connected to SAW filters 10, 12, respectively. Filters 9, 11, 10, 12 are connected to terminals 2, 3, 4 and 5, respectively.

In the circuits described above, switches 7, 8, 13, 17 are each formed of a semiconductor switching device, e.g. a diode or a field effect transistor. LPFs 9, 11, 16 and diplexers 6, 14, 15 are formed of a conductive pattern provided on a dielectric layer. This dielectric layer and other dielectric layer form a laminated body.

Figure 5:
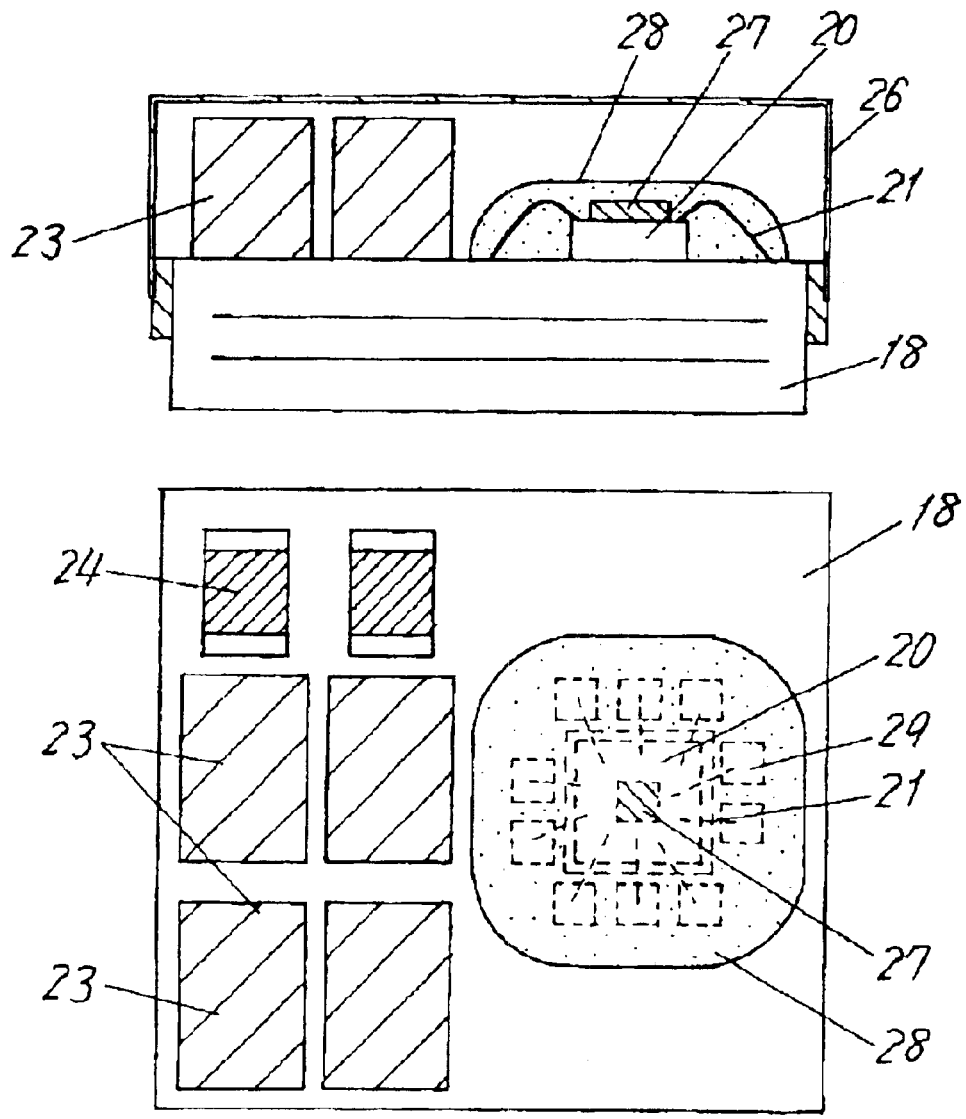
FIG. 5 is a schematic diagram of an RF hybrid switch module in accordance with the first embodiment of the invention.

FIG. 5 shows an RF hybrid switch module in accordance with the first embodiment. The module includes cover (hereinafter referred to as "micro-cavity") 27 defining a cavity at an elastic vibrating portion of SAW filter chip 20, potting resin 28, and pad 29 formed on laminated body 18 for wire bonding.

In the first embodiment, the elastic surface portion of SAW filter chip 20 is formed with micro-cavity 27 and fortified with potting resin 28, thereby being hermetically sealed over laminated body 18 without interfering an elastic vibration. Chip devices 23, 24 are mounted next to chip 20.

Consequently, the module of this embodiment has a smaller size and a lower profile than a conventional module and can be manufactured inexpensively since this module does not require an alumina package. Further, The plate-like laminated body 18 may be divided into an area for SAW filter chip 20 and an area for chip devices 23, 24, thus allowing only the area for the chip devices, for example, to have soldering paste printed thereon, to be subjected to reflow, and to be cleaned. This facilitates the chip devices to be mounted easily and enhances cost reduction of the module.

Second Exemplary Embodiment

Figure 6:
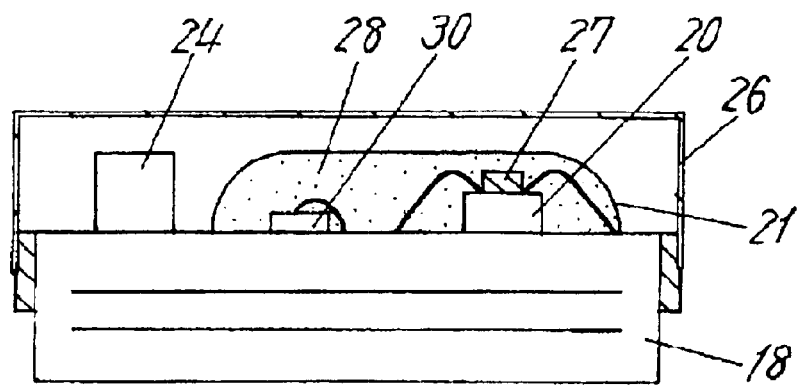
FIG. 6 is a schematic diagram of an RF hybrid switch module in accordance with the second embodiment of the invention.
Figure 6:
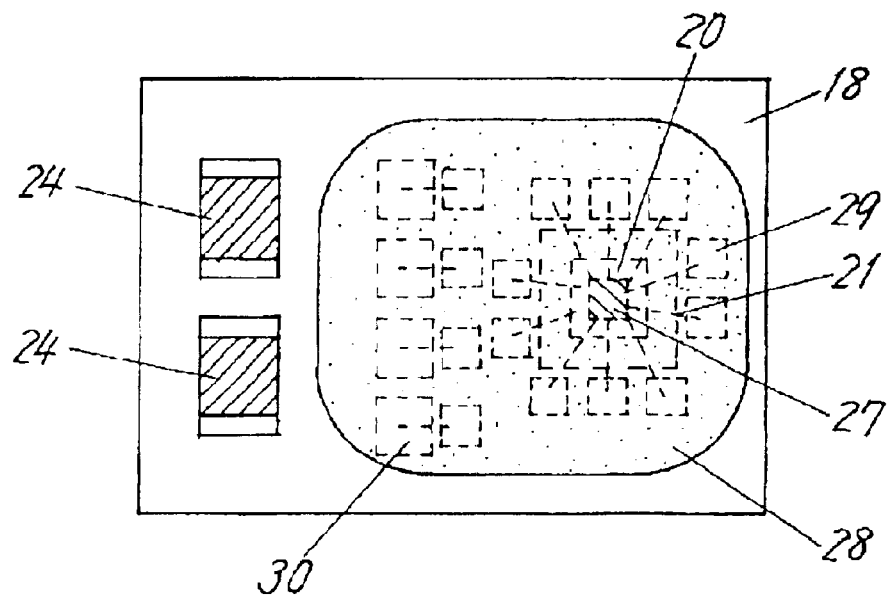

FIG. 6 shows a radio-frequency hybrid switch module in accordance with a second exemplary embodiment of the present invention. An elastic surface portion of SAW filter chip 20 is provided with micro-cavity 27, a cover defining a cavity. Micro-cavity 27 is fortified with potting resin 28 as in the module shown in FIG. 5, thus allowing the elastic surface portion to be hermetically sealed over laminated body 18 without interfering with elastic vibration. Bare-chip diode 30 is mounted on laminated body 18 similarly to SAW filter chip 20 and coated with potting resin 28.

Therefore, the module of the present embodiment has a smaller size and a lower profile than a conventional module and can be manufactured inexpensively since this module does not require an alumina package. Further, plate-like laminated body 18 is divided into an area for SAW filter chip 20 and an area for chip devices 23, 24 thus allowing only the area for the chip devices, for example, to have soldering paste printed thereon, to be subjected to reflow, and to be cleaned. This facilitates the chip devices to be mounted easily and enhances cost reduction of the module. The similar advantages are obtainable even if a semiconductor switching device, e.g. a field effect transistor, is used instead of bare-chip diode 30.

Figure 7:
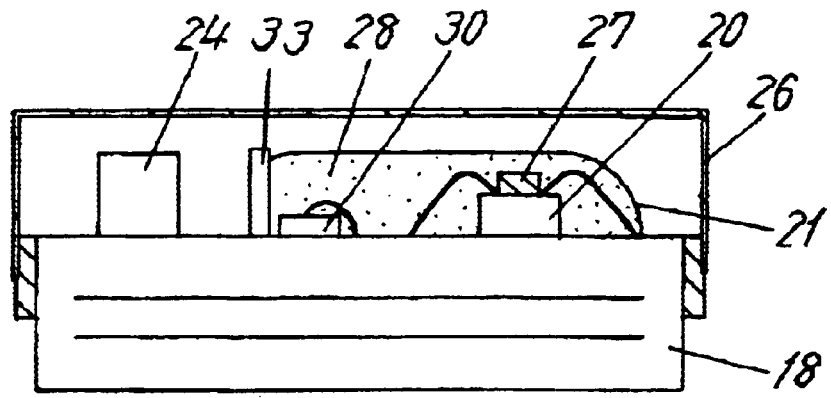
FIG. 7 is a schematic diagram of another RF hybrid switch module in accordance with the second embodiment of the invention.
Figure 7:
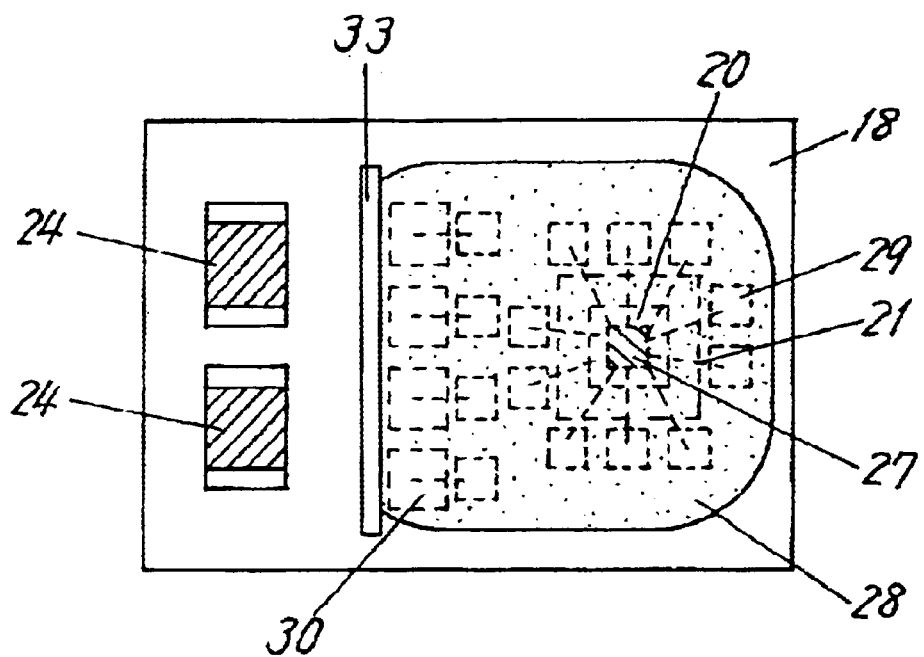

As shown in FIG. 7, wall 33 made of resin may be provided on the periphery of the bare chips on the laminated body. Wall 33 is taller than the bare chips. The bare chips placed across wall 33 from the chip devices may be covered with the potting resin. Thus, the potting resin is prevented from flowing into a region not requiring the potting resin, and a region to be covered with the potting resin is limited. Accordingly, a clearance for an overflowing potting resin can be minimized, and this reduces the size of the module easily and improves production yield of the module.

Wall 33 may be formed next to chip devices 24 or may be formed to enclose the bare chips (including SAW filter chip 20 and bare-chip diode 30 in FIG. 6).

As shown in FIG. 6, at least one of the SAW filter and the bare chip is disposed on one side of the laminated body. In other words, the bare chips are separated from the chip devices on the laminated body by being disposed in the area positioned in horizontal or vertical relation to the area for the chip devices. This allows the module to be manufactured since soldering paste can be applied to laminated body 18 by thick film printing to solder the chip devices, and since flux can be cleaned efficiently after the soldering.

The potting resin may cover the entire surface of the laminated body on which the chips and the chip devices are mounted. This improves mechanical reliability of the module. In addition, the module can be manufactured easily and inexpensively since a region (not shown) to be coated with the potting resin need not be specifically restricted.

Third Exemplary Embodiment

Figure 8:
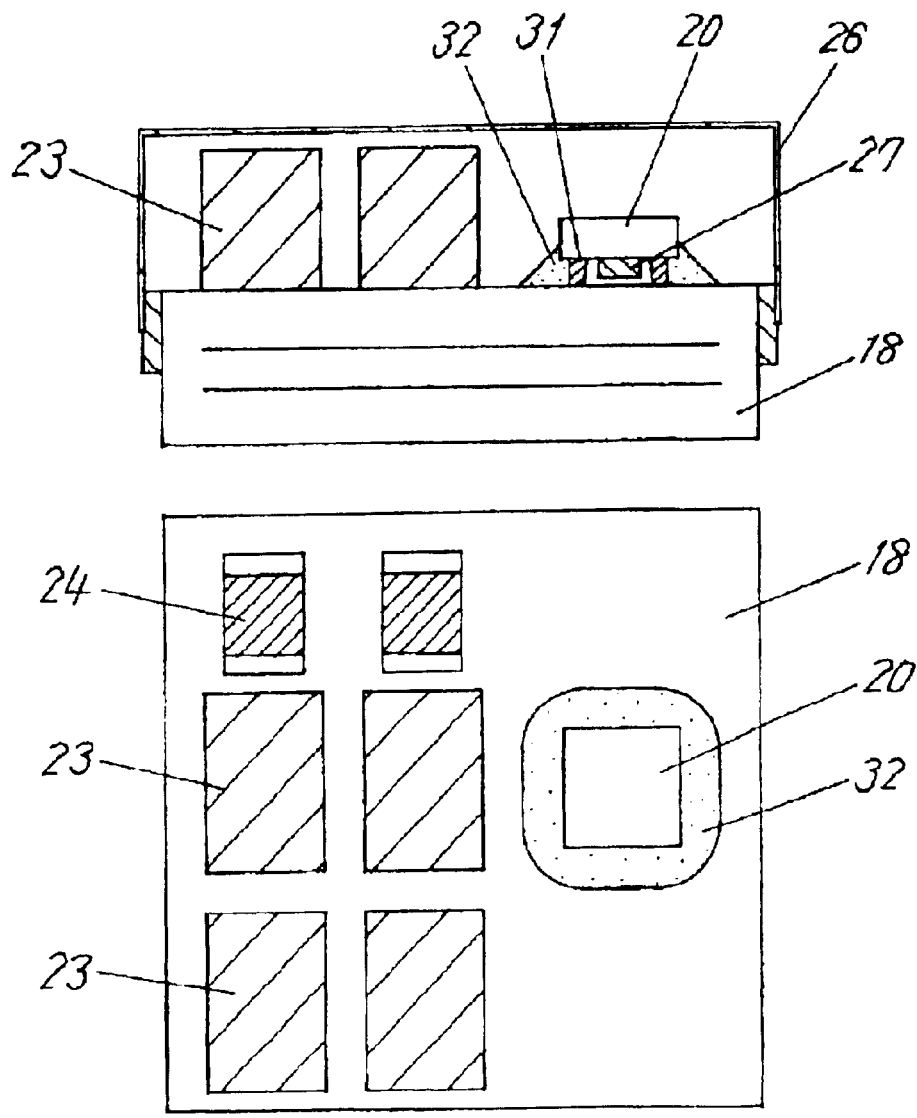
FIG. 8 is a schematic diagram of an RF hybrid switch module in accordance with the third embodiment of the invention.

FIG. 8 shows a radio-frequency (RF) hybrid switch module in accordance with a third exemplary embodiment. The module includes bump 31 and sealing resin 32. Bump 31 functioning as an electrode for SAW filter chip 20 is electrically connected to a pad provided on laminated body 18 by flip chip bonding. A space between SAW filter chip 20 and laminated body 18 is filled with sealing resin 32 for covering a connection between bump 31 and the pad. This seals the periphery of this connection hermetically without contacting cap 26. An elastic surface portion of SAW filter chip 20 is provided with micro-cavity 27, a cover defining a cavity similarly to the modules shown in FIGS. 5 and 6, thus being hermetically sealed without interfering with elastic vibration at the elastic surface portion.

The RF hybrid switch module of the present embodiment has a smaller size and a lower profile than a conventional module, and can be made inexpensively since this module does not require an alumina package. Further, plate-like laminated body 18 is divided into an area for SAW filter chip 20 and an area for chip devices 23, 24, thus allowing only the area for chip devices, for example, to have soldering paste printed thereon, to be subjected to reflow, and to be cleaned. This facilitates the mounting of the chip devices and enhances cost reduction of the module.

Fourth Exemplary Embodiment

Figure 9:
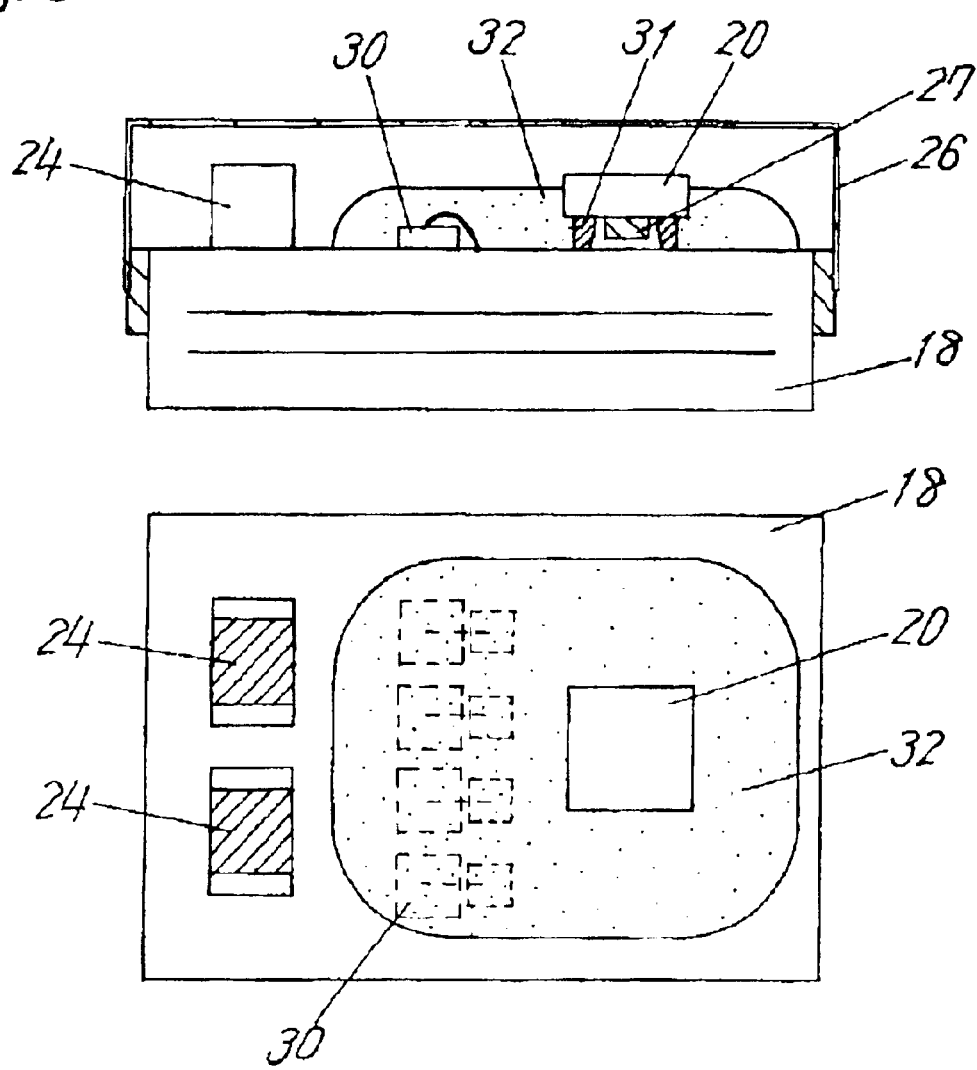
FIG. 9 is a schematic diagram of an RF hybrid switch module in accordance with the fourth embodiment of the invention.
Figure 10:
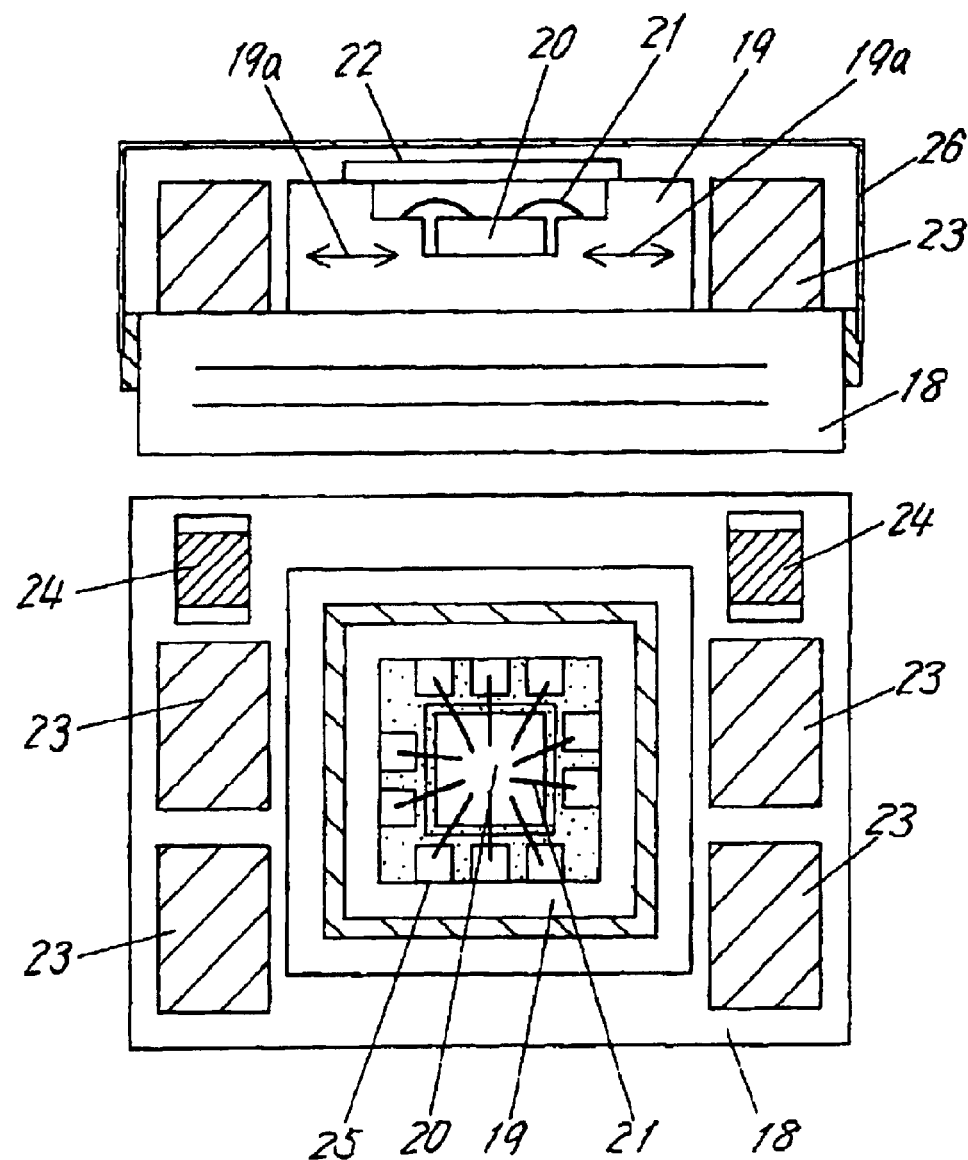
FIG. 10 is a schematic diagram of a conventional antenna duplexer.

FIG. 9 shows a radio-frequency (RF) hybrid switch module in accordance with a fourth exemplary embodiment. In this module, bump 31 of SAW filter chip 20 is electrically connected to a pad provided on laminated body 18 by flip chip bonding. A space between SAW filter chip 20 and laminated body 18 is filled with sealing resin 32 for covering a connection between bump 31 and the pad. The resin seals the periphery of this connection hermetically without contacting cap 26. An elastic surface portion of SAW filter chip 20 is provided with micro-cavity 27 and a cover defining a cavity similarly to the modules shown in FIGS. 5 and 6, thereby being hermetically sealed without interfering with elastic vibration occurring at the elastic surface portion. Together with the SAW filter chip, bare-chip diode 30 may be coated with sealing resin 32.

The RF hybrid switch module of the fourth embodiment has a smaller size and a lower profile than a conventional module and can be manufactured inexpensively since this module does not require an alumina package. Further, plate-like laminated body 18 is divided into an area for SAW filter chip 20 and an area for chip devices 23, 24, thus allowing only the area for chip devices, for example, to have soldering paste printed thereon, to be subjected to reflow, and to be cleaned. This facilitates the mounting of the chip devices and enhances cost reduction of the module. The similar advantages can be obtained even when a semiconductor switching, e.g. a field effect transistor, is used instead of bare-chip diode 30.

In the first to fourth embodiments, a GSM/DCS dual-band device is explained. However, the present invention is not limited to this and may be applicable to, for example, single-band and triple-band devices.

The number of chip devices and the number of SAW filter chips that have been illustrated in the first to fourth embodiments do not restrict the technique of the present invention. The same advantages can be obtained from, for example, a module including no chip device. In addition, the module may not include cap 26.

The laminated body of the RF hybrid switch module in accordance with each of the first to fourth embodiments may include a thin ceramic substrate previously sintered and smoothed at its surface to which the SAW filter is mounted. Specifically, plural yet-to-be-sintered green sheets are affixed to the ceramic substrate, and a conductive pattern is printed on or transferred to the green sheet for forming a circuit. The resultant laminated body is thereafter sintered and then having the SAW filter mounted thereon. In this way, the SAW filter can be mounted to the smooth surface of the previously-sintered ceramic substrate, and this provides the module with extremely high reliability. Alumina, forsterite or the like is usable for the ceramic substrate. The green sheet, upon being made of material sintered at a low temperature, allows material having a low resistance, e.g. silver and copper, to be used for the conductive pattern forming the circuit, and this reduces loss in the circuit.

INDUSTRIAL APPLICABILITY

In a radio-frequency hybrid switch module of the present invention, an elastic surface portion for generating a surface acoustic wave is provided with a cavity and is hermetically sealed. Thus, a surface acoustic wave filter can be mounted on a laminated body similarly to other chip devices. This allows the module to have an extremely small size and a low-profile.

What is claimed is:

1. A radio-frequency (RF) hybrid switch module comprising:
    a laminated body including a dielectric layer;
    a diplexer;
    a switching circuit;
    a low pass filter (LPF);
    a conductive pattern on said dielectric layer, for forming at least one of said diplexer, said switching circuit, and said LPF;
    a surface acoustic wave (SAW) filter mounted on said laminated body;
    a cover on said SAW filter, for forming a cavity which allows surface acoustic wave vibration and for hermetically sealing said cavity;
    a semiconductor switching device mounted on said laminated body, for forming a part of said switching circuit;
    a pad provided on said laminated body;
    a bonding wire connecting said SAW filter to said pad; and
    a potting resin covering said pad, said bonding wire, and said SAW filter.

2. The RF hybrid switch module of claim 1, wherein said laminated body further includes a ceramic substrate on which said SAW filter is mounted.

3. The RF hybrid switch module of claim 1,
    wherein said semiconductor switching device is a bare chip, and
    wherein said potting resin covers said bare chip.

4. The RF hybrid switch module of claim 3, further comprising:
    a wall provided at a periphery of said bare chip on said laminated body, said wall being taller than said bare chip,
    wherein said potting resin covers said bare chip from said wall.

5. The RF hybrid switch module of claim 3, further comprising:
    a chip device included in at least one of said diplexer, said switching circuit and said LPF, said chip device being mounted on said laminated body,
    wherein a position for at least one of said SAW filter and said bare chip and a position for said chip device are mounted in respective two regions separated from each other on said laminated body.

6. The RF hybrid switch module of claim 1, wherein said potting resin covers substantially an entire surface of said laminated body including said semiconductor switching device and said SAW filter mounted thereon.

7. A radio-frequency (RF) hybrid switch module comprising:
    a laminated body including a dielectric layer;
    a diplexer;
    a switching circuit;
    a low pass filter (LPF);
    a conductive pattern on said dielectric layer, for forming at least one of said diplexer, said switching circuit, and said LPF;
    a surface acoustic wave (SAW) filter mounted on said laminated body;
    a cover on said SAW filter, for forming a cavity which allows surface acoustic wave vibration and for hermetically sealing said cavity;
    a semiconductor switching device mounted on said laminated body, for forming part of said switching circuit; and
    a potting resin for covering substantially an entire surface of said laminated body including said semiconductor switching device and said SAW filter mounted thereon.

8. The RF hybrid switch module of claim 7, wherein said laminated body further includes a ceramic substrate on which said SAW filter is mounted.

9. A radio-frequency (RF) hybrid switch module comprising:
    a laminated body including a dielectric layer;
    a diplexer;
    a switching circuit;
    a low pass filter (LPF);
    a conductive pattern on said dielectric layer, for forming at least one of said diplexer, said switching circuit, and said LPF;
    a surface acoustic wave (SAW) filter mounted on said laminated body;
    a cover on said SAW filter, for forming a cavity which allows surface acoustic wave vibration and for hermetically sealing said cavity;
    a semiconductor switching device mounted on said laminated body, for forming a part of said switching circuit;
    a pad provided on said laminated body;
    a bump provided at said SAW filter for electrically connecting said SAW filter to said pad by flip chip bonding; and
    a potting resin with which a space between said SAW filter and said laminated body is filled for covering said pad and said bump.

10. The RF hybrid switch module of claim 9, wherein said laminated body further includes a ceramic substrate on which said SAW filter is mounted.

11. A method of manufacturing a radio-frequency hybrid switch module including a laminated body having a dielectric layer, a conductive pattern provided on the dielectric layer, and a surface acoustic wave (SAW) filter mounted on the laminated body, said method comprising the steps of:

forming the conductive pattern on a green sheet by one of printing and transferring;

affixing the green sheet to a sintered ceramic substrate;

sintering the ceramic substrate and the green sheet to form the laminated body; and mounting the SAW filter on the ceramic substrate.

* * * * *

UNITED STATES PATENT AND TRADEMARK OFFICE
CERTIFICATE OF CORRECTION

PATENT NO. : 6,759,925 B2
DATED : July 6, 2004
INVENTOR(S) : Yuki Satoh et al.

It is certified that error appears in the above-identified patent and that said Letters Patent is hereby corrected as shown below:

Title page,
Item [30], Foreign Application Priority Data, delete "2003-07276" and insert -- 2000-307276 --.

Signed and Sealed this

Fifteenth Day of February, 2005

JON W. DUDAS
*Director of the United States Patent and Trademark Office*